United States Patent
Chen et al.

(10) Patent No.: US 7,541,953 B2
(45) Date of Patent: Jun. 2, 2009

(54) SELF-CALIBRATING CURRENT SOURCE ARRAYS

(75) Inventors: Hsin-Hung Chen, Hsinchu (TW); Jaesik Lee, Bridgewater, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 11/318,188

(22) Filed: Dec. 23, 2005

(65) Prior Publication Data

US 2007/0146182 A1    Jun. 28, 2007

(51) Int. Cl.
    *H03M 1/66*    (2006.01)
(52) U.S. Cl. .................................. 341/120; 341/144
(58) Field of Classification Search .............. 341/144, 341/121, 120, 118, 145
    See application file for complete search history.

(56) References Cited

U.S. PATENT DOCUMENTS

| | | | |
|---|---|---|---|
| 2,457,220 A | 12/1948 | Fowler et al. | |
| 2,618,420 A | 11/1952 | Levine | |
| 2,706,072 A | 4/1955 | Furno | |
| 3,677,437 A | 7/1972 | Haigler | |
| 4,835,535 A * | 5/1989 | Shibayama et al. | 341/120 |
| 5,522,512 A | 6/1996 | Archer et al. | |
| 5,761,877 A | 6/1998 | Quandt | |
| 5,771,657 A | 6/1998 | Lasher et al. | |
| 5,873,488 A | 2/1999 | Guerra | |
| 5,897,024 A | 4/1999 | Coughlin et al. | |
| 5,955,980 A * | 9/1999 | Hanna | 341/120 |
| 6,130,632 A * | 10/2000 | Opris | 341/120 |
| 6,166,670 A * | 12/2000 | O'Shaughnessy | 341/136 |
| 6,260,695 B1 | 7/2001 | Tasber et al. | |
| 6,318,051 B1 | 11/2001 | Preiss | |
| 6,331,830 B1 * | 12/2001 | Song et al. | 341/121 |
| 6,363,687 B1 | 4/2002 | Luciano et al. | |
| 6,578,734 B1 | 6/2003 | Coughlin et al. | |
| 6,581,356 B2 | 6/2003 | Kim | |
| 6,633,301 B1 * | 10/2003 | Dallas et al. | 345/597 |
| 6,738,000 B2 * | 5/2004 | Boxho | 341/120 |
| 6,805,259 B2 | 10/2004 | Stevens et al. | |
| 6,847,568 B2 * | 1/2005 | Gogl et al. | 365/205 |
| 6,885,958 B2 * | 4/2005 | Yaklin | 702/107 |
| 6,925,774 B2 | 8/2005 | Peterson | |
| 7,019,677 B1 * | 3/2006 | Soman et al. | 341/144 |

OTHER PUBLICATIONS

Cong, Y. et al., "A 1.5-V 14-Bit 100-MS/s Self-Calibrated DAC," IEEE Journal of Solid-State Circuits, vol. 38, No. 12, Dec. 2003, pp. 2051-2060.

(Continued)

*Primary Examiner*—Peguy JeanPierre
(74) *Attorney, Agent, or Firm*—John F. McCabe (57) ABSTRACT

One apparatus includes an array of current sources, a digital memory, and a calibration circuit. The digital memory is configured to store one set of digital calibration values for each of the current sources and to apply each stored set of digital calibration values to the corresponding current source to set the output current of the corresponding output current source. The calibration circuit is configured to update each set of digital calibration values in the memory in a manner that reduces mismatches between output currents of different ones of the current sources.

15 Claims, 9 Drawing Sheets

OTHER PUBLICATIONS

Bugeja, A.R. et al., "A Self-Trimming 14-b 100-MS/s CMOS DAC," IEEE Journal of Solid-State Circuits, vol. 35, No. 12, Dec. 2000, pp. 1841-1852.

Groeneveld, D.W.J. et al., "A Self-Calibration Technique for Monolithic High-Resolution D/A Converters," IEEE Journal of Solid-State Circuits, vol. 24, No. 6, Dec. 1989, pp. 1517-1522.

* cited by examiner

SELF-CALIBRATING CURRENT SOURCE ARRAYS

BACKGROUND

1. Technical Field

The invention relates generally to electronic current sources and devices and methods that use such sources.

2. Discussion of Related Art

CMOS technology enables the production of digital-to-analog converters (DACs) with 14 bits of resolution. Implementations of the DACs have used the current-steering arrays. In such an array, the maximum resolution is limited by mismatches between the output currents of different current sources of the array. To achieve high resolution, a current-steering array may be fabricated in a self-calibrating form. Self-calibrating current-steering arrays often need less layout area on an integrated circuit than other types of high-resolution current-steering arrays.

Figure 1:
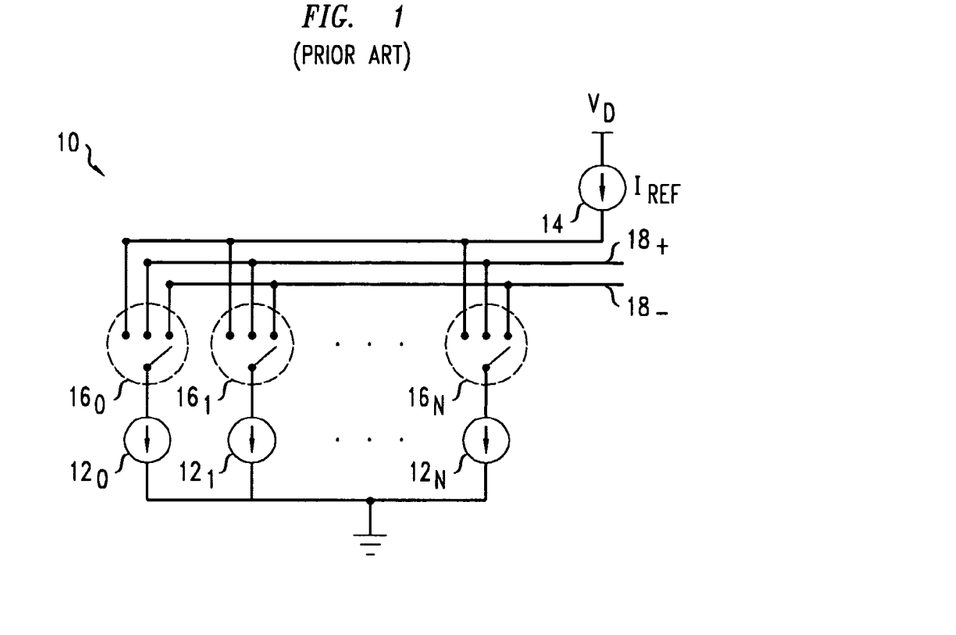
FIG. 1 illustrates a conventional self-calibrating current-steering array.

FIG. 1 illustrates a portion of a differential current-steering array 10 that is self-calibrating. The differential current-steering array 10 includes an array of (N+1) fixed current sources $12_0, 12_1, \ldots, 12_N$ and an array of (N+1) three-way switches $16_0, \ldots 16_N$, e.g., transistor-type switches. Each switch $16_1, \ldots, 16_N$ is in correspondence with one of the fixed current sources $12_1, \ldots, 12_N$ of the current-steering array 10. Each switch $16_j$ connects the corresponding current source $12_j$ to a plus output port $18_+$, a minus output port $18_-$, or to a reference current source 14.

During operation, the three-way switches $16_0, \ldots, 16_N$ connect N of the N+1 fixed current sources $12_0, \ldots, 12_N$ to the output ports $18_-, 18_+$ such that individual ones of the N current sources $12_0, \ldots, 12_N$ only connect to one output ports $18_-, 18_+$. Then, if the individual current sources $12_0, \ldots, 12_N$ are matched to produce equal output currents, the difference of the currents from the output port $18_-$ and the output port $18_+$ is in the set $\{NI_{REF}, (N-1)I_{REF}, \ldots, -NI_{REF}\}$. Thus, the differential current-steering array 10 is a variable current source with equally spaced differential current outputs as long as the current sources $12_0, \ldots, 12_N$ are calibrated to produce equal currents.

In current-steering array 10, the individual three-way switches $16_0, \ldots, 16_N$ are transistor switching circuits well-known to those of skill in the art. The transistor switching circuits can be controlled by digital gate voltages so that the differential current-steering array 10 functions as a DAC.

During operation, one three-way switch $16_j$ of the array also connects one current source $12_j$ to the reference current source 14 so that its output current may be calibrated to the fixed value $I_{REF}$. In particular, the (N+1) current sources $12_0, \ldots, 12_N$ are sequentially connected to the reference current source 14 so that their output currents can be calibrated to $I_{REF}$ during operation.

The extra current source $12_0$ enables the performance of calibrations of the individual current sources $12_1, \ldots, 12_N$ during operation of the current-steering array 10. During the calibration of a current source $12_j$ with j being in $\{1, \ldots, N\}$, three-way switches $16_0$ and $16_j$ are set to substitute extra current source $12_0$ for the current source $12_j$ in the current steering array 10. This substitution connects the extra current source $12_0$ to one of the output ports $18_-, 18_+$ to which the current source $12_j$ previously connected. During the substitution, the three-way switch $16_j$ connects the current source $12_j$ to the reference current source for calibration. For the above reasons, calibrations of the current sources $12_0, \ldots, 12_N$ can be performed as background processes without stopping operation of the current-steering array 10.

Figure 2:
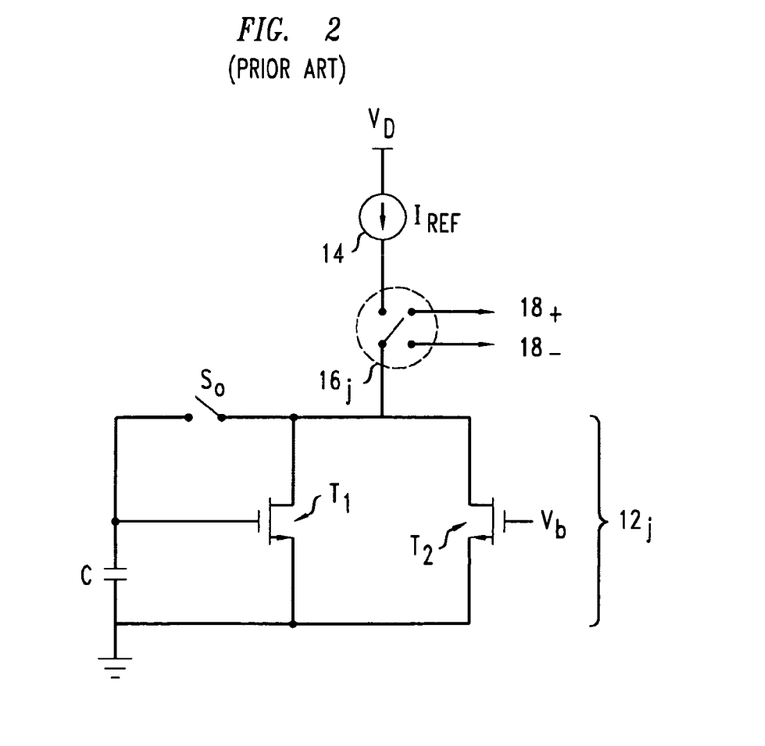
FIG. 2 illustrates one current source of the array shown in FIG. 1.

FIG. 2 is a circuit diagram for exemplary current source $12_j$ of the current-steering array 10 as shown in FIG. 1. The current source $12_j$ includes a fine internal current source that includes capacitor C and field-effect transistor $T_1$, a coarse internal current source that includes field-effect transistor $T_2$ and fixed voltage source $V_b$, and a switch $S_0$. The fine and coarse internal current sources may, e.g., produce about 5% and 95%, respectively, of the total output current of the current source $12_j$. The adjustability of the fine internal current source enables calibration of the current source $12_j$.

During normal operation, the switch $S_0$ is open, and the three-way switch $16_j$ connects the current source $12_j$ to one of the output ports $18_+, 18_-$. Then, the two internal current sources produce the combined output current of the current source $12_j$. During normal operation, the charge on the capacitor C fixes the gate voltage on the transistor $T_1$ and its associated drain current.

During calibration operation, the charge on the capacitor C is reset to so that the drain currents of both transistors $T_1$ and $T_2$ sum to about $I_{REF}$. To perform a calibration, the switch $S_0$ is closed, and the three-way switch $16_j$ is set to connect the current source $12_j$ to reference current source 14. Then, the drain current flow through the transistor $T_1$ adjusts so that the sum of the currents through both transistors $T_1, T_2$ becomes equal to $I_{REF}$. During this operation, a current flow also adjusts the charge on the capacitor C so that the capacitor C provides an appropriate drain voltage for the drain current in the transistor $T_1$. Thus, such a calibration resets the current source $12_j$ to produce an output current of $I_{REF}$.

Referring to FIGS. 1 and 2, the differential current-steering array 10 has several properties that can cause current imbalances between the current sources $12_0, \ldots, 12_N$. First, opening the three-way switches $16_0, \ldots, 16_N$ to output ports $18_+, 18_-$ can transfer charges to the gates of the internal transistors $T_1$ in the corresponding current sources $12_0, \ldots, 12_N$ thereby changing the setting for their output currents. Second, in the current sources $12_0, \ldots, 12_N$, leakage through the gates of the internal transistors $T_1$ can change the charges on the capacitors C thereby changing the output currents of the current sources $12_0, \ldots, 12_N$. Third, switching individual current sources $12_0, \ldots, 12_N$ into and out of connection with the output ports $18_+, 18_-$ to do calibrations will typically produce calibration frequency spurs in the output currents at the output ports $18_+, 18_-$.

SUMMARY

Various apparatus include arrays of current sources that can be steered by digital voltage sources.

One embodiment features an apparatus that includes an array of current sources, a digital memory, and a calibration circuit. The digital memory is configured to store one set of digital calibration values for each of the current sources and to apply each stored set of digital calibration values to the corresponding current source to set the output current of the corresponding output current source. The calibration circuit is configured to update each set of digital calibration values in the memory in a manner that reduces mismatches between output currents of different ones of the current sources.

One embodiment features an apparatus that includes an array of current sources, an output port, and an array of switches. Each of the current sources of the array includes a first current source and a multi-bit digital-to-analog converter and having an output line connected to add output currents of the first current source and the digital-to-analog converter. Each switch connects a corresponding one of the output lines to the output port.

Another embodiment features a method of operating current sources of a current source array. The method includes determining whether an output current of each current source of the array has a mismatch with respect to a reference output current. The method includes finding updated digital values for calibrating the each current source such that the updated digital values reduce the corresponding determined mismatch. The method includes storing the updated values to a digital memory such that the digital memory subsequently applies the updated digital values to calibration inputs of the each current source.

BRIEF DESCRIPTION OF THE DRAWINGS

The illustrative embodiments are described more fully by the Figures and detailed description. The inventions may, however, be embodied in various forms and are not limited to embodiments described in the Figures and detailed description.

DETAILED DESCRIPTION OF ILLUSTRATIVE EMBODIMENTS

Figure 3:
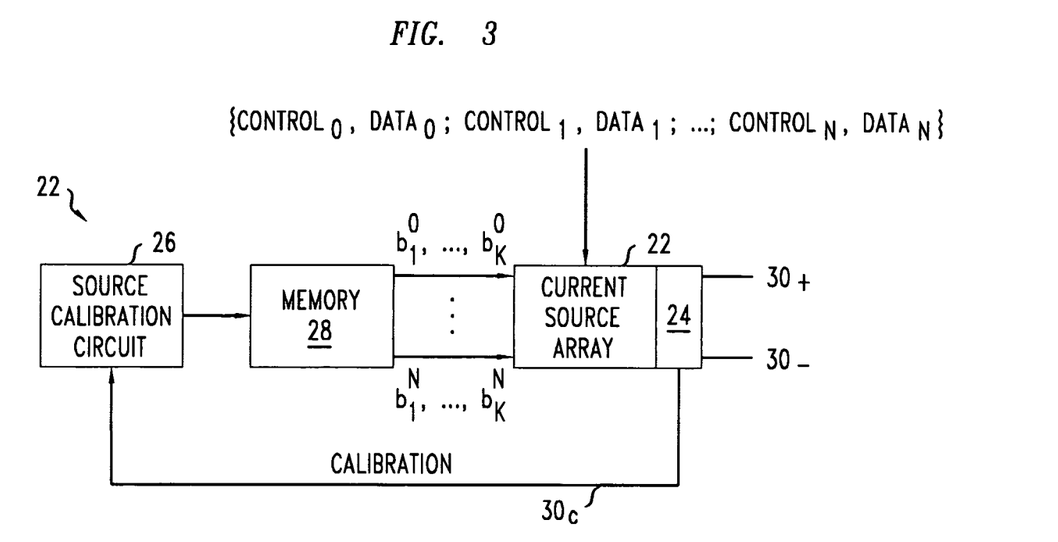
FIG. 3 is a block diagram illustrating one embodiment of a self-calibrating current-steering array.

FIG. 3 illustrates a self-calibrating differential current-steering array 20 that includes a current source array 22, a digitally controlled switching array 24, a source calibration circuit 26, and a digital memory 28. The current source array 22 includes an array of (N+1) current sources that digitally calibrated to provide substantially equal output currents. The controllable switching array 24 connects to individual current sources in the current source array 22 to an output port $30_+$, $30_-$ or to calibration line $30_C$ in a manner responsive to digital data signals $Data_0, \ldots, Data_N$ and digital control signals $Control_0, \ldots, Control_N$. The source calibration circuit 26 measures output currents of individual current sources in the current source array 22 and stores to the digital memory 28 updated digital calibration values for setting these output currents. The memory 28 stores a set of digital calibration values for calibrating each of the current sources of the current source array 22. The memory 28 also includes circuitry for applying each set of stored digital calibration values, i.e., $\{b^0_m\}, \ldots,$ and $\{b^N_m\}$, to calibration inputs of the corresponding one of the current sources in the current source array 22, i.e., to maintain the appropriate "output current" calibration.

Figure 4:
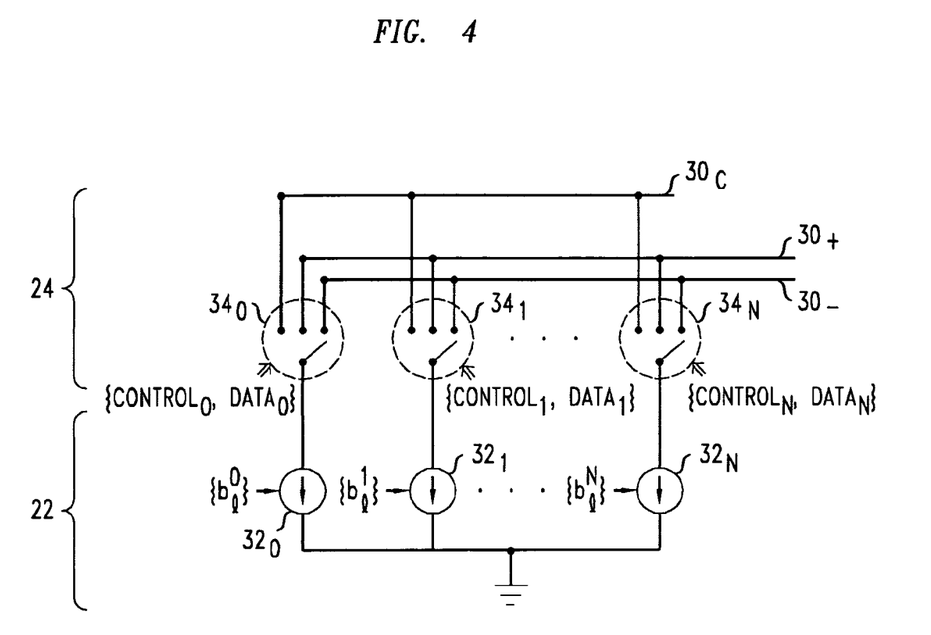
FIG. 4 is a circuit diagram illustrating an exemplary array of current sources for the current-steering array of FIG. 3.

FIG. 4 illustrates an exemplary construction of the current source array 22 and the digital controlled switching array 24 in the current-steering array 20 shown in FIG. 3. The current source array 22 includes (N+1) current sources $32_0, 32_1, \ldots 32_N$. Each current source $32_j$ is calibrated by a corresponding array of K digital calibration voltages, i.e., $b^j_1, \ldots, b^j_K$, which are applied thereto by the digital memory 28. The K voltages are dynamically set to maintain the output current of each current source $32_0, \ldots, 32_N$ about equal to a reference current value of $I_{REF}$. The digitally controlled switching array 24 has (N+1) three-way switches $34_0, \ldots, 34_N$. Each three-way switch $34_0, \ldots, 34_N$ connects to an output line of a corresponding one of the current sources $32_0, \ldots, 32_N$. The three-way switches $34_j$ controllably connect the corresponding current source $32_j$ to the plus output port $30_+$, the minus output port $30_-$, or the calibration port $30_C$.

A set of applied digital data and control voltages, i.e., $Control_0, Data_0; \ldots;$ and $Control_N, Data_N$, determine the connections of the fixed current sources $32_0, \ldots, 32_N$ at each time. By changing one or more of the control and/or data voltages in the set, the currents on the plus and minus output ports $30_+, 30_-$, may be changed.

If each current source $32_0, \ldots, 32_N$ is calibrated to produce substantially the same output current, the difference of the currents from output port $30_+$ and from output port $30_-$ will be substantially in the set $\{NI_{REF}, (N-1)I_{REF}, \ldots, -NI_{REF}\}$. The particular value of the current difference is fixed by the set of input binary data signals $Data_1, \ldots,$ and $Data_N$. Thus, available values for the difference between the currents from the plus and minus output ports $30_+, 30_-$ are substantially evenly spaced. Such a property is often desirable when the input digital data signals or voltages $Data_1, \ldots,$ and $Data_N$ operate the current-steering array 20 as a digital-to-analog converter (DAC).

Figure 5:
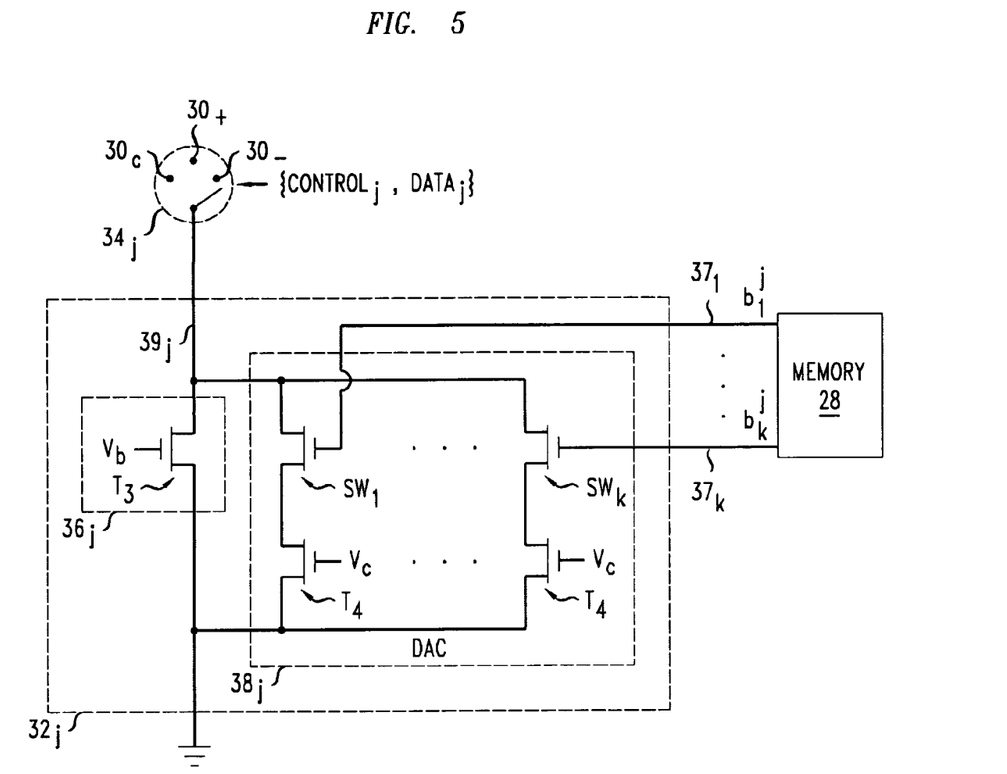
FIG. 5 is a circuit diagram illustrating an exemplary construction for the current sources in the array of current sources shown in FIG. 3.

FIG. 5 shows an exemplary construction for an individual current source $32_j$, e.g., one of the current sources $32_0, \ldots, 32_N$ of FIG. 4. The current source $32_j$ includes a fixed coarse internal current source $36_j$, an adjustable fine internal current source $38_j$, and a line $39_j$. The line $39_j$ carries the sum of the currents outputted by the coarse and fine internal current sources $36_j, 38_j$ to the three-way switch $34_j$. The fixed internal coarse current source $36_j$ includes, e.g., a field-effect transistor $T_3$ and a fixed voltage source $V_b$. The voltage source $V_b$ may, e.g., be set to cause about 90% or more, e.g., about 95%, of the output current of the current source $32_j$ to go through the drain of the field-effect transistor (FET) $T_3$. The fine internal current source $38_j$ produces an output current whose value depends on a set of binary calibration voltages $b^j_1, \ldots,$ and $b^j_K$ that the digital memory 28 applies to calibration inputs $37_1, \ldots, 37_K$. In particular, the fine internal current source $38_j$ functions as a digital-to-analog converter (DAC) for the digital calibration signal set $\{b^j_1, \ldots, b^j_K\}$.

The internal fine current source $38_j$ includes a parallel array of K substantially identical switchable current sources. The output currents of the switchable current sources are summed to produce the output current of the internal fine current source $38_j$. Each switchable current source includes an incremental current source and an FET switch $SW_1, \ldots, SW_N$. Each incremental current source includes an FET $T_4$ whose gate is connected to a fixed voltage source $V_C$. Each FET switch $SW_p$ determines whether the corresponding incremental current source is or is not added to the output current of the internal fine current source $38_j$. For example, the FET switch $SW_p$ is typically open for one applied value of the corresponding binary calibration voltage $b^j_p$ and closed for the other applied value of the binary calibration voltage $b^j_p$. Thus, the fine current source $38_j$ produces output currents whose values are substantially given by 0, i, 2i, ..., and Ki where "i" is the output current of any one of incremental current source, e.g., $I_{REF}$. That is, the fine current source $38_j$ functions as a digital-to-analog converter (DAC) for the binary calibration signals $b^j_1, \ldots, b^j_K$ in a unary form.

Figure 6:
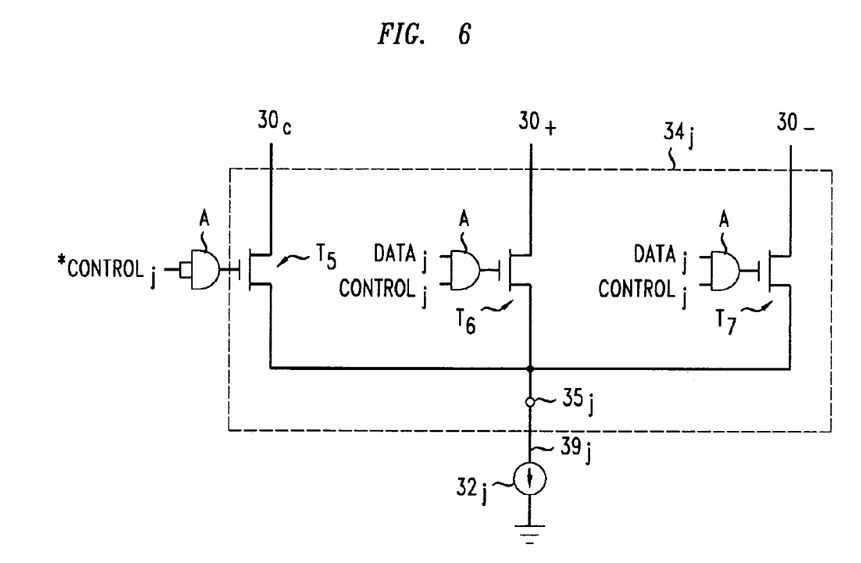
FIG. 6 is a circuit diagram illustrating an exemplary construction for the three-way switches in the array of current sources shown in FIG. 3.

FIG. 6 shows an exemplary construction for three-way switch $34_j$, e.g., one of the three-way switches $32_0, \ldots, 34_N$ of FIG. 4. The three-way switch $34_j$ includes switching transistors $T_5, T_6, T_7$ whose gates are controlled by AND-gates, A, The AND-gates have inputs that are operated by the digital control signal Control$_j$ and the input binary data signal Data$_j$. The value of the control signal Control$_j$ determines whether the corresponding current source $32_j$ is connected to one of the output ports $30_+$, $30_-$, i.e., normal operation, or is connected to calibration line $30_C$, i.e., calibration operation. The data signal Data$_j$ determines whether the current source $32_j$ is connected to output port $30_+$ or to the output port $30_-$ during normal operation. That is, the data signal Data$_j$ determines the contribution of the current from the current source $32_j$ to the differential output current of the differential current-steering array 20. The three-way switch $34_j$ may optionally include another transistor $35_j$ at its input, e.g., for enabling the disconnection of the current source $32_j$ from all three outputs $30_+$, $30_-$, $30_C$.

Figure 7:
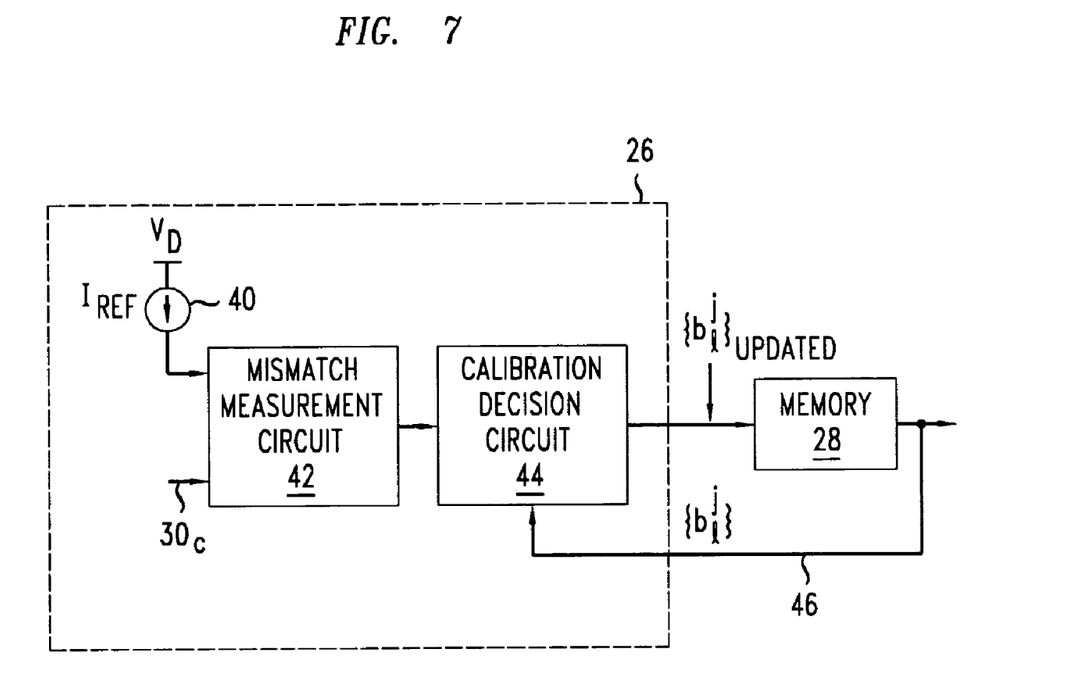
FIG. 7 is a block diagram illustrating an exemplary construction for the source calibration circuit in the current-steering array shown in FIG. 3.

FIG. 7 illustrates an exemplary construction for the source calibration circuit 26 that includes a reference current source 40, a mismatch measurement circuit 42, and a calibration decision circuit 44. The reference current source 40 is connected to a voltage source $V_D$ and produces a fixed output current $I_{REF}$. The reference current source 40 is used to calibrate individual current sources $32_0, \ldots, 32_N$. The mismatch measurement circuit 42 is configured to compare the output current of an individual current source $32_j$ that is being calibrated to the reference current source 40 and to produce a digital output signal that is representative of the mismatch between theses two current sources $32_j$, 40. The calibration decision circuit 44 produces an updated set of binary calibration voltages $\{b^j_1, \ldots, b^j_K\}_{updated}$ for controlling the "K" incremental current sources in the individual current source $32_j$ being calibrated. The calibration decision circuit 44 produces each updated calibration set $\{b^j_1, \ldots, b^j_K\}_{updated}$ responsive to the current mismatch found by the mismatch measurement circuit 42 and stores the updated set of binary control voltages $\{b^j_1, \ldots, b^j_K\}_{updated}$ to the digital memory 28. Optionally, the calibration decision circuit 44 may generate the updated set $\{b^j_1, \ldots, b^j_K\}_{updated}$ in response to receiving the present set of binary calibration voltages $\{b^j_1, \ldots, b^j_K\}$ from the digital memory 28 via a feedback line 46.

Figure 8:
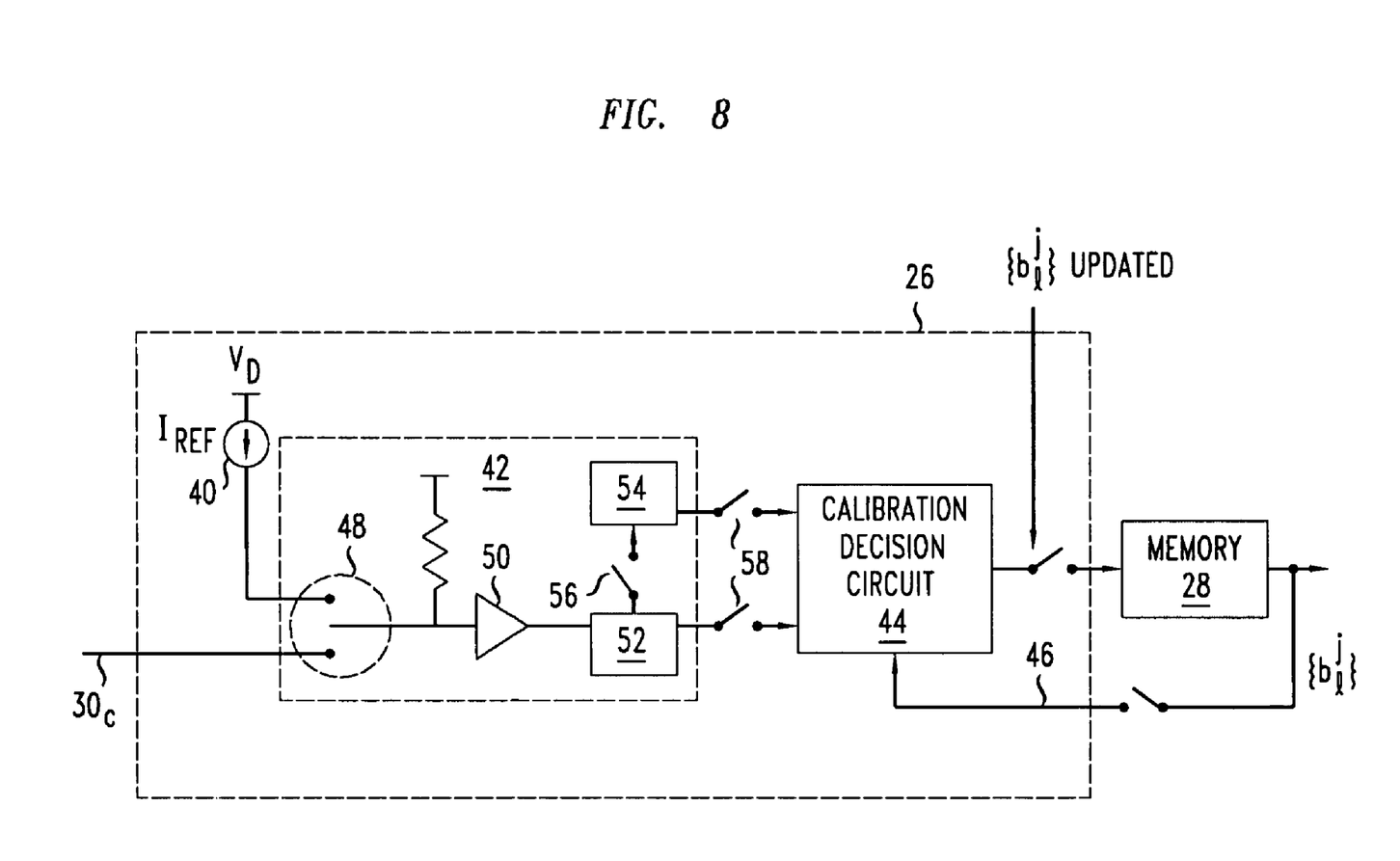
FIG. 8 is a block diagram illustrating a specific construction for the source calibration circuit shown in FIG. 7.

FIG. 8 illustrates an exemplary construction for the mismatch measurement circuit 42 of FIG. 7. The mismatch measurement circuit 42 includes a two-way switch 48, a fixed resistor R, a modulator 50, a digital detector 52, a register 54, and coupled switches 56, 58. The two-way switch 48 selects the reference current source 40 or the calibration line $30_C$ connecting to the current source being calibrated, e.g., the current source $32_j$. The two-way switch 48 connects the selected current source to ground via the fixed resistor R. The input of the fixed resistor R connects to an input of a modulator 50, which outputs a signal train representative of the modulator's input voltage, i.e., when averaged over a temporal period of suitable length. The digital detector 52 measures the signal train from the modulator 50 thereby producing a digital measure of the output current from the current source selected by the two-way switch 48. The calibration decision circuit 44 is connected to receive the digital measures of the output currents for both current sources connected to the two-way switch 48. In particular, one of the digital measures is stored in the register 54 so that both digital measures from the digital detector 52 can be sent to the calibration decision circuit 44 in the same cycle. The calibration decision circuit 44 is configured to compare the digital measures to determine whether a mismatch is present between output currents of the reference current source 40 and the individual current source connected to the calibration line $30_C$, e.g., the current source $32_j$. Based on the comparison, the calibration decision circuit 44 is configured to produce and transfer a set of updated binary calibration voltages, e.g., the digital calibration voltages $\{b^j_1, \ldots, b^j_K\}_{updated}$, for the selected current source, e.g., the current source $32_j$, to the digital memory 28. In some embodiments, the calibration decision circuit 44 also uses the present digital calibration voltages $\{b^j_1, \ldots, b^j_K\}$ received from feedback line 46 to determine the updated calibration voltages $\{b^j_1, \ldots, b^j_K\}_{updated}$.

The calibration decision circuit 44 may, e.g., incrementally change the present control voltages $\{b^j_1, \ldots, b^j_K\}$ in response to the current source $32_j$ having a smaller or larger output current than the reference current source 40. The incremental change could, e.g., involve resetting one of the control voltages $\{b^j_1, \ldots, b^j_K\}$ to turn on or off the associated switch $SW_1, \ldots, SW_K$ in the internal fine current source $38_j$. In such an embodiment, a series of the incremental calibration cycles may be required to match the selected current source $32_j$ to the reference current source 40.

In one exemplary embodiment, the modulator 50 is a one-bit or multi-bit delta-sigma ($\Delta\Sigma$) amplifier, and the digital detector 52 is a simple counter. Since the input voltage is a low frequency signal, the $\Delta\Sigma$ modulator 50 produces a high output signal for a portion of a temporal averaging period that is representative of the input voltage, i.e., provided that the temporal averaging period is sufficiently long. For example, a higher input voltage would produce the high signal output for a larger portion of the preselected temporal averaging period, and a lower input voltage would produce such an output for a smaller portion of the preselected temporal averaging period. Then, the length of the period for the high output is a measure of the input voltage. Thus, in such an embodiment, the digital detector 52 is configured to count the number of high counts over the preselected temporal averaging period. Then, the number of high counts provides a digital measure of the output current of the current source being measured.

Figure 9:
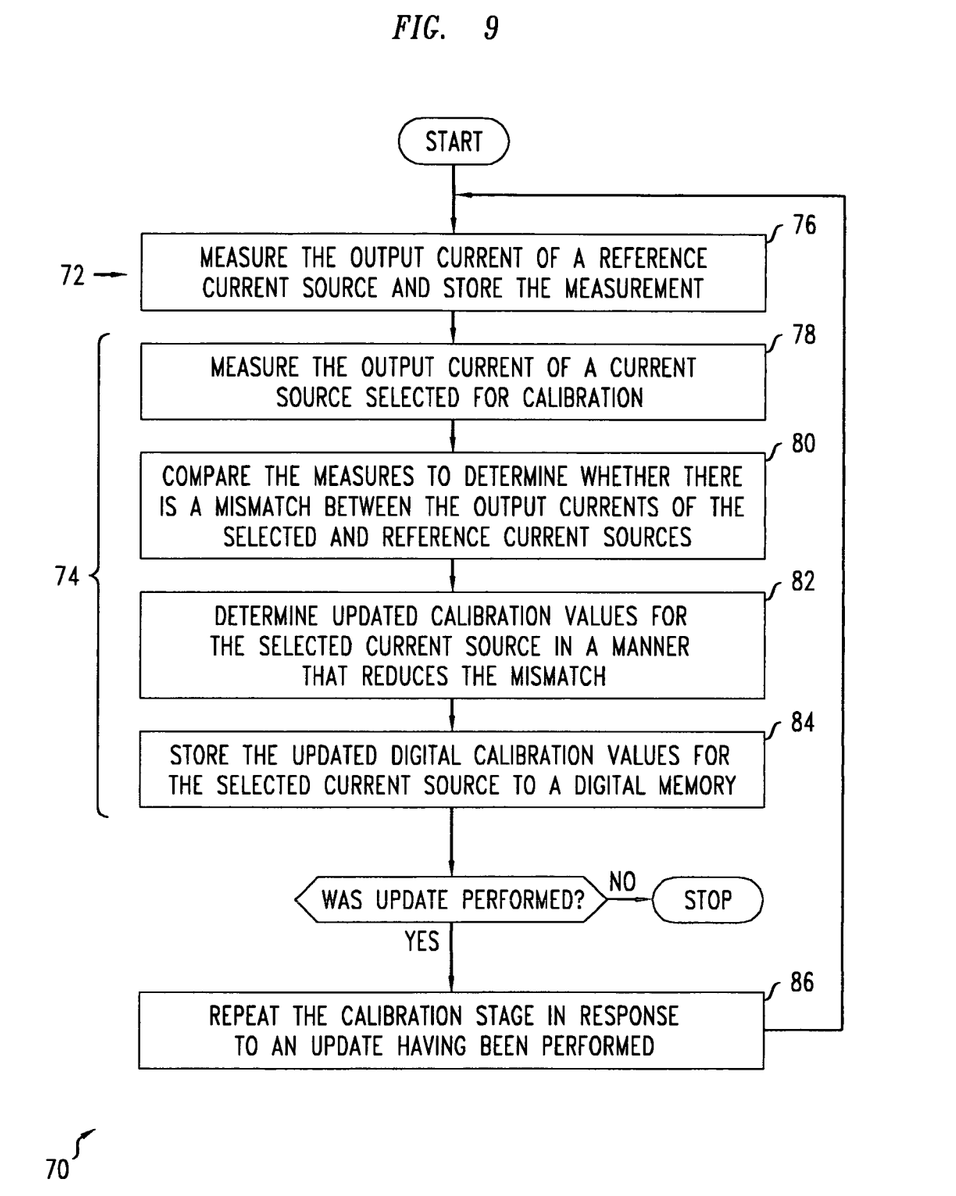
FIG. 9 is a flow chart illustrating an exemplary method for dynamically calibrating an array of current sources, e.g., current sources of the self-calibrating array of FIGS. 3-4.

FIG. 9 illustrates a method 70 of calibrating the current sources of a current-steering array to have substantially equal output currents. For example, the method 70 may be performed in embodiments of current-steering arrays illustrated by FIGS. 3-8. The method 70 includes performing an initialization stage 72 and a sequence of calibration stages 74 for each current source of the array being calibrated.

In the initialization stage 72, the method 70 includes measuring the output current of a fixed reference current source and storing a digital measure of the output current (step 76). In the mismatch measurement circuit 42 of FIG. 8, the measuring step may include, e.g., setting two-way switch 48 to select the reference current source 40, zeroing the digital detector 52, and then, counting the number of high output signals from the $\Delta\Sigma$ modulator 50 during a preselected temporal averaging period. In the mismatch measurement circuit 42 of FIG. 8, the storing step may include storing the final count to the register 54. The measurement period is selected so that the final count is indicative of the output current of the reference current source 40 connected to the input of the ΔΣ modulator 50.

In each of calibration stage 74, the method 70 involves adjusting the output current of a selected current source of the parallel array. The selected current source is, e.g., one of the current sources 32, ..., $32_N$ shown in FIGS. 4-5.

During each calibration stage 74, the method 70 includes measuring the output current of the selected current source (step 78). For example, in the mismatch measurement circuit 42 of FIG. 8, this measuring step includes resetting the two-way switch 48 to the calibration line $30_C$ connected to a selected current source, e.g., the current source $32_j$. The measuring step also includes zeroing the count in the digital detector 52, and then, counting the number of high output signals from the ΔΣ modulator 50 during the preselected temporal averaging period, i.e., a period of the same length as in step 76. The final count by the digital detector 52 will be a measure indicative of the output current of the selected current source, e.g., the current source $32_j$.

During each calibration stage 74, the method 70 includes comparing the digital measures of the output currents of the selected and reference current sources to determine whether there is a mismatch therebetween (step 80). For example, in the mismatch measurement circuit 42 of FIG. 8, the comparing step includes transmitting the measured digital counts for the reference current source and the current source connected to the calibration line $30_C$ to the calibration decision circuit 44, and then, comparing these two measured final counts. The comparing step provides a qualitative evaluation of the mismatch between the output currents of the two current sources. The qualitative evaluation determines the sign of the mismatch and whether the magnitude of the mismatch is above a threshold value for adjusting the output current of the current source connected to the calibration line $30_C$.

During each calibration stage 74, the method 70 includes determining updated digital calibration values or voltages for the current source being calibrated in a manner that reduces any mismatch determined at step 80 (step 82). The updated calibration values can incrementally increase or decrease the output current of the current source being calibrated.

For current source $32_j$ of FIG. 5, determining step 82 includes, e.g., finding a set of updated binary calibration values or voltages $\{b^j_1, \ldots b^j_K\}_{updated}$ for controlling the DAC $38_j$. Indeed, changing one of the binary calibration voltages $b^j_1, \ldots, b^j_K$ increases or decreases the output current of the DAC $38_j$ by connecting to the line $39_j$ or disconnecting from the line $39_j$ one of the parallel current sources therein. The connecting or disconnecting involves, e.g., resetting one switch $SW_1, \ldots, SW_K$ between its ON and OFF states. The determining step may involve using the present calibration values $\{b^j_1, \ldots, b^j_K\}$ to identify which of the switches $SW_1, \ldots, SW_K$ to reset.

During each calibration stage 74, the method 70 includes storing the updated digital calibration voltages or values for the selected current source to a digital memory, e.g., digital memory 28 of FIG. 8 (step 84). After performance of the storing step, the digital memory applies the updated digital calibration values or voltages to the selected current source, e.g. the current source $32_j$, thereby updating its output current.

At each calibration stage 74, the method 70 includes looping back to repeat the initialization and calibration stages 72, 74 in response to an update of the digital calibration values having been performed (step 86). The calibration stage 74 is repeated until the comparing step determines that the mismatch between the selected current source and the reference current source is below a preselected threshold. If the mismatch being below the threshold, the selected current source is reset to function in the current source array without an update of its digital calibration values, and the next current source of the current source array is selected for calibration.

In various embodiments, the method 70 performs calibrations of the individual current sources of a current source array in a background mode. In the background mode, the calibration stages 74 involve swapping current sources selected for calibration with an extra current source, e.g., current source $32_0$ in FIG. 4. The extra current source $32_0$ performs the current-generating function of the selected current source in the current source array while the selected current source is being calibrated. For example, input digital data $Data_j$ for the current source $32_j$ is applied to the three-way switch $34_0$ of the current source $32_0$ while the current source $32_j$ is being calibrated.

Figure 10:
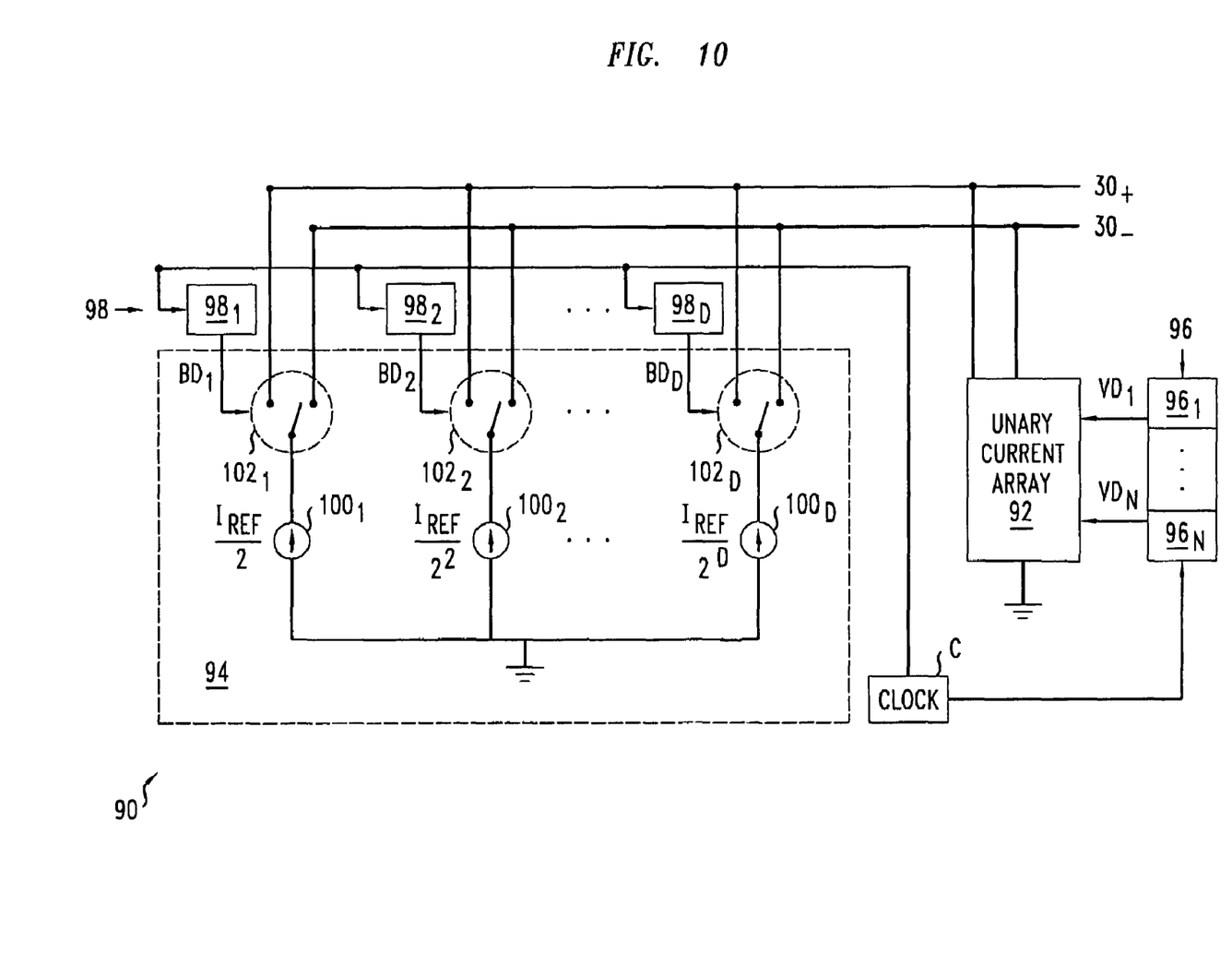
FIG. 10 illustrates a current-steering array that includes a unary self-calibrating current-steering array, e.g., current source array of FIG. 3, and a binary current-steering array.

FIG. 10 illustrates a multi-bit digital-to-analog converter (DAC) 90 that produces a differential current output between output ports $30_+$ and $30_-$. The DAC 90 includes a unary current source array 92, a binary current source array 94, associated arrays of latches $96_1, \ldots, 96_N$ and $98_1, \ldots, 98_D$, and a clock C. In the DAC 90, the output ports $30_+$ and $30_-$ provide total output currents that sum output currents from individual current sources of the unary and binary current arrays 92, 94. At the output ports $30_+$ and $30_-$, the output currents are determined by the values of input unary data $\{UD_1, \ldots, UD_N\}$ from the latches $96_1, \ldots, 96_N$ and input binary data $\{BD_1, \ldots, BD_D\}$ from the latches $98_1, \ldots, 98_D$. The DAC 90 has an output cycle determined by the clock C, which operates the arrays of latches $96_1, \ldots, 96_N$ and $98_1, \ldots, 98_D$.

The unary current source array 92 is an embodiment of the current source array 22 illustrated by FIGS. 3-7, wherein the "N+1" individual current sources $32_0, \ldots, 32_N$ are calibrated to have equal output currents. During operation, N of the current sources $32_0, \ldots, 32_N$ of the unary current source array 92 connect via three-way switches $34_0, \ldots, 34_N$ of FIG. 4 to the output ports $30_+$, $30_-$. In particular, each of N of the three-way switches $34_0, \ldots, 34_N$ is controlled by a corresponding one of the unary control data values of the set $\{UD_1, \ldots, UD_N\}$. During operation, one of the three-way switches $34_0, \ldots, 34_N$ also connects a selected one of the current sources $32_0, \ldots, 32_N$ to the line $30_C$ for calibration, e.g., according to the method 70 of FIG. 9. Thus, background calibrations may maintain output currents of the current sources $32_0, \ldots, 32_N$ of the unary current array 92 at about the same value, i.e., $I_{REF}$.

The binary current source array 94 includes "D" current sources $100_1, \ldots,$ and $100_D$ with fixed output currents of $I_{REF}/2^1$, $I_{REF}/2^2, \ldots,$ and $I_{REF}/2^D$, respectively. During operation, each two-way switch $102_1, \ldots, 102_D$ connects a corresponding one of the current sources $100_1, \ldots, 10_D$ to one of the output ports $30_+$, $30_-$. The current sources $100_1, \ldots, 100_D$ are not recalibrated during operation. In particular, each of the two-way switches $102_1, \ldots 102_D$ is controlled by a corresponding binary control data value from the set $\{BD_1, \ldots, BD_D\}$, which determines the total output current of the binary current source array 94.

In the DAC 90, precisions of the binary current sources $100_1, \ldots, 100_D$ have less impact on the overall precision, because the binary current sources $100_1, \ldots, 100_D$ provide less significant contributions to the total output current than the unary current sources $32_0, \ldots, 32_N$. For that reason, combining a self-calibrating unary current source array with a binary current source array as in the DAC 90 may enable extending the number of digits of precision that are obtainable without requiring background calibrations of all individual current sources therein.

In exemplary embodiments, the unary current source array 92 has "$2^F+1$" individual current sources $32_0, \ldots, 32_N$, i.e., $2^F=N$, and the binary current source array 94 has D individual current sources $100_1, \ldots, 100_D$ SO that the DAC 90 has a precision of $2^{F+D}$. That is, the DAC 90 converts F+D bits of digital data into an analog output current in each data cycle. The array of latches 96 holds the F bits that control the unary current source array 92 in one clock cycle. The F bits of control data, i.e., $UD_1, \ldots, UD_N$, have a unary form to operate $N=2^F$ of the switches $34_0, \ldots 34_N$ of the current source array 22. In unary form, a number P is, e.g., encoded as a sequence of N digits, wherein P of the digits are 1's and N-P digits are 0's. The array of latches 98 holds the D bits of digital data suited to control the binary current source 94 in one clock cycle. The D bits of digital data, i.e., $BD_1, \ldots, BD_D$, operate the D switches $102_1, \ldots, 102_D$ corresponding to the different magnitude current sources $100_1, \ldots, 100_D$ of the binary current source array 94.

From the above disclosure, the figures, and the claims, other embodiments will be apparent to those of skill in the art.

What we claim is:

1. An apparatus, comprising:
an array of current sources;
an output port for the array;
a digital memory being configured to store one set of digital calibration values for each of the current sources and to apply each stored set of digital calibration values to the corresponding current source to set the output current of the corresponding current source; and
a calibration circuit being configured to update each set of digital calibration values in the memory in a manner that reduces mismatches between output currents of different ones of the current sources; and
wherein each one of the current sources comprises a switch capable of switching a current output of the one of the current sources between the output port and an input of the calibration; and
wherein the calibration circuit is configured to receive from the memory the set of digital calibration values of one of the current sources prior to updating the set therefor.

2. The apparatus of claim 1, further comprising:
a reference current source; and
wherein the calibration circuit is connected to compare output currents of the current sources of the array to an output current of the reference current source.

3. An apparatus, comprising:
an array of current sources;
an output port for the array;
a digital memory being configured to store one set of digital calibration values for each of the current sources and to apply each stored set of digital calibration values to the corresponding current source to set the output current of the corresponding current source; and
a calibration circuit being configured to update each set of digital calibration values in the memory in a manner that reduces mismatches between output currents of different ones of the current sources; and
wherein each one of the current sources comprises a switch capable of switching a current output of the one of the current sources between the output port and an input of the calibration circuit; and
wherein each individual current source of the array includes a multi-bit digital-to-analog converter connected to receive from the memory the set of digital values corresponding to the individual current source and to adjust the output current of the individual current source in a manner responsive to the received set.

4. The apparatus of claim 3, further comprising:
a reference current source; and
wherein the calibration circuit is connected to compare output currents of the current sources of the array to an output current of the reference current source.

5. An apparatus, comprising:
an array of current sources, each current source of the array comprising a coarse current source and a multi-bit digital-to-analog converter and having an output line connected to add output currents of the coarse current source and the digital-to-analog converter; and
an output port for the array; and
wherein each one of the current sources of the array includes a switch capable of switching the output line of the one of the current sources between the output port and a calibration port for the array.

6. The apparatus of claim 5, wherein the digital-to-analog converter further comprises a parallel array of adjustable current sources.

7. The apparatus of claim 6, further comprising a digital circuit connected to apply a corresponding set of digital calibration values to each of the digital-to-analog converters.

8. The apparatus of claim 7, wherein the digital circuit is configured to set the digital calibration values in a manner that reduces mismatches between currents on the output lines of different ones of the current sources of the array.

9. The apparatus of claim 7, wherein each switch is capable of connecting the corresponding one of the output lines to a measurement input of the calibration circuit.

10. The apparatus of claim 5, further comprising:
a second array of current sources and corresponding switches, each switch of the second array capable of connecting a corresponding one of the current sources of the second array to the output port; and
wherein each current source of the second array is configured to output to the corresponding switch a different current than others of the current sources of the second array.

11. The apparatus of claim 10, wherein each current source of the second array is configured to output a smaller output current than the current sources of the first array.

12. The apparatus of claim 10, wherein each current source of the second array is configured to output an output current that differs by about a factor of two from an output current of another current source of the second array.

13. A method of operating current sources of a current source array, comprising:
switching one of the current sources from being connected to one of the output ports of the array to being connected to a calibration circuit for the array;
with the calibration circuit, determining a mismatch between an output current of the one of the current sources and a reference output current;
finding updated digital values for calibrating the one of the current sources such that the updated digital values reduce the determined mismatch;
storing the updated digital values to a digital memory such that the digital memory subsequently applies the updated digital values to a calibration input of the one of the current sources; and
repeating the determining, finding and storing steps for the one of the current sources in response to a magnitude of the determined mismatch between the output current of the one of the current sources and the reference output current being greater than a preselected threshold.

14. The method of claim 13, wherein the step of determining includes comparing a measured output current of the one of the current sources to a measured output current of a reference current source.

15. The method of claim 13, wherein the calibration input of the one of the current sources is a data input of a corresponding digital-to-analog converter.

* * * * *